US012584956B2

(12) United States Patent
Ashizawa et al.

(10) Patent No.: US 12,584,956 B2
(45) Date of Patent: Mar. 24, 2026

(54) HEATER DRIVE CONTROLLING APPARATUS, ELECTRONIC COMPONENT HANDLING APPARATUS, ELECTRONIC COMPONENT TESTING APPARATUS, AND HEATER DRIVE CONTROLLING METHOD

(71) Applicant: ADVANTEST Corporation, Tokyo (JP)

(72) Inventors: Takuro Ashizawa, Tokyo (JP); Hirotaka Sasaki, Tokyo (JP); Keisuke Nitta, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 234 days.

(21) Appl. No.: 18/325,358

(22) Filed: May 30, 2023

(65) Prior Publication Data

US 2023/0393189 A1 Dec. 7, 2023

(30) Foreign Application Priority Data

Jun. 2, 2022 (JP) ................................. 2022-090485

(51) Int. Cl.
*G01R 31/28* (2006.01)
*G05D 23/19* (2006.01)
*H05B 1/02* (2006.01)

(52) U.S. Cl.
CPC ..... *G01R 31/2875* (2013.01); *G05D 23/1917* (2013.01); *H05B 1/023* (2013.01); *H05B 2203/007* (2013.01)

(58) Field of Classification Search
CPC ................ G01R 31/2875; G01R 19/10; G01R 19/16571; G01R 31/2862; G05D 23/1917;
(Continued)

(56) References Cited

U.S. PATENT DOCUMENTS 6,304,073 B1 * 10/2001 Saito ...................... G01R 31/01
324/757.04
6,897,670 B2 * 5/2005 Burns ................ G01R 31/2893
324/750.02
(Continued)

FOREIGN PATENT DOCUMENTS

CN 103476163 A 12/2013
CN 105164544 A 12/2015
(Continued)

OTHER PUBLICATIONS

Office Action issued in corresponding Taiwanese Patent Application No. 112118906, mailed May 29, 2024 (5 pages).

(Continued)

*Primary Examiner* — Huy Q Phan
*Assistant Examiner* — Haidong Zhang
(74) *Attorney, Agent, or Firm* — Osha Bergman Watanabe & Burton LLP

(57) ABSTRACT

A heater drive controlling apparatus for an electronic component testing apparatus includes a breaker disposed between a power source and heaters, and a controller that controls electric currents supplied from the power source to the heaters in order according to a first priority set for the heaters such that a sum of the supplied electric currents is within a rated current of the breaker. The electronic component testing apparatus includes a test chamber, a thermal-stress applying chamber, and a thermal-stress removing chamber each of which includes the heaters.

8 Claims, 8 Drawing Sheets

(58) Field of Classification Search

CPC . H05B 1/023; H05B 2203/007; H05B 3/0019

See application file for complete search history.

(56) References Cited

U.S. PATENT DOCUMENTS

| | | | |
|---|---|---|---|
| 7,242,206 | B2 | 7/2007 | Takekoshi et al. |
| 9,677,822 | B2 | 6/2017 | Yosef et al. |
| 2009/0183866 | A1 | 7/2009 | Sakaue et al. |
| 2009/0230949 | A1 | 9/2009 | Moriya et al. |
| 2010/0102796 | A1 | 4/2010 | Moriya et al. |
| 2010/0102797 | A1 | 4/2010 | Moriya et al. |
| 2010/0224352 | A1* | 9/2010 | Stuckey .............. H01L 23/4735 |
| | | | 165/185 |
| 2014/0253157 | A1 | 9/2014 | Dean et al. |
| 2016/0327595 | A1* | 11/2016 | Reinders ................... G06F 1/26 |
| 2017/0200660 | A1 | 7/2017 | Jovanovic et al. |
| 2020/0027799 | A1 | 1/2020 | Jovanovic et al. |
| 2020/0205245 | A1 | 6/2020 | Ma et al. |
| 2021/0333228 | A1 | 10/2021 | Petersen et al. |
| 2021/0333316 | A1 | 10/2021 | Petersen et al. |
| 2022/0026487 | A1 | 1/2022 | Arai et al. |
| 2022/0082636 | A1 | 3/2022 | Jovanovic et al. |
| 2022/0337046 | A1* | 10/2022 | Erven .................. H01H 71/125 |

FOREIGN PATENT DOCUMENTS

| | | |
|---|---|---|
| JP | H10-136554 A | 5/1998 |
| JP | 2004-009099 A | 1/2004 |
| JP | 2014-16258 A | 1/2014 |
| JP | 6496346 B2 | 4/2019 |
| JP | 2022-21239 A | 2/2022 |
| KR | 10-2002-0036524 A | 5/2002 |
| KR | 10-2004-0064432 A | 7/2004 |
| KR | 10-2015-0103512 A | 9/2015 |
| TW | 200947173 A | 11/2009 |
| TW | 202033053 A | 9/2020 |
| TW | 202132795 A | 9/2021 |
| TW | 202146910 A | 12/2021 |

OTHER PUBLICATIONS

Office Action issued in corresponding Korean Patent Application No. 10-2023-0068203, mailed Feb. 21, 2025 (10 pages).

* cited by examiner

_Fig. 2_
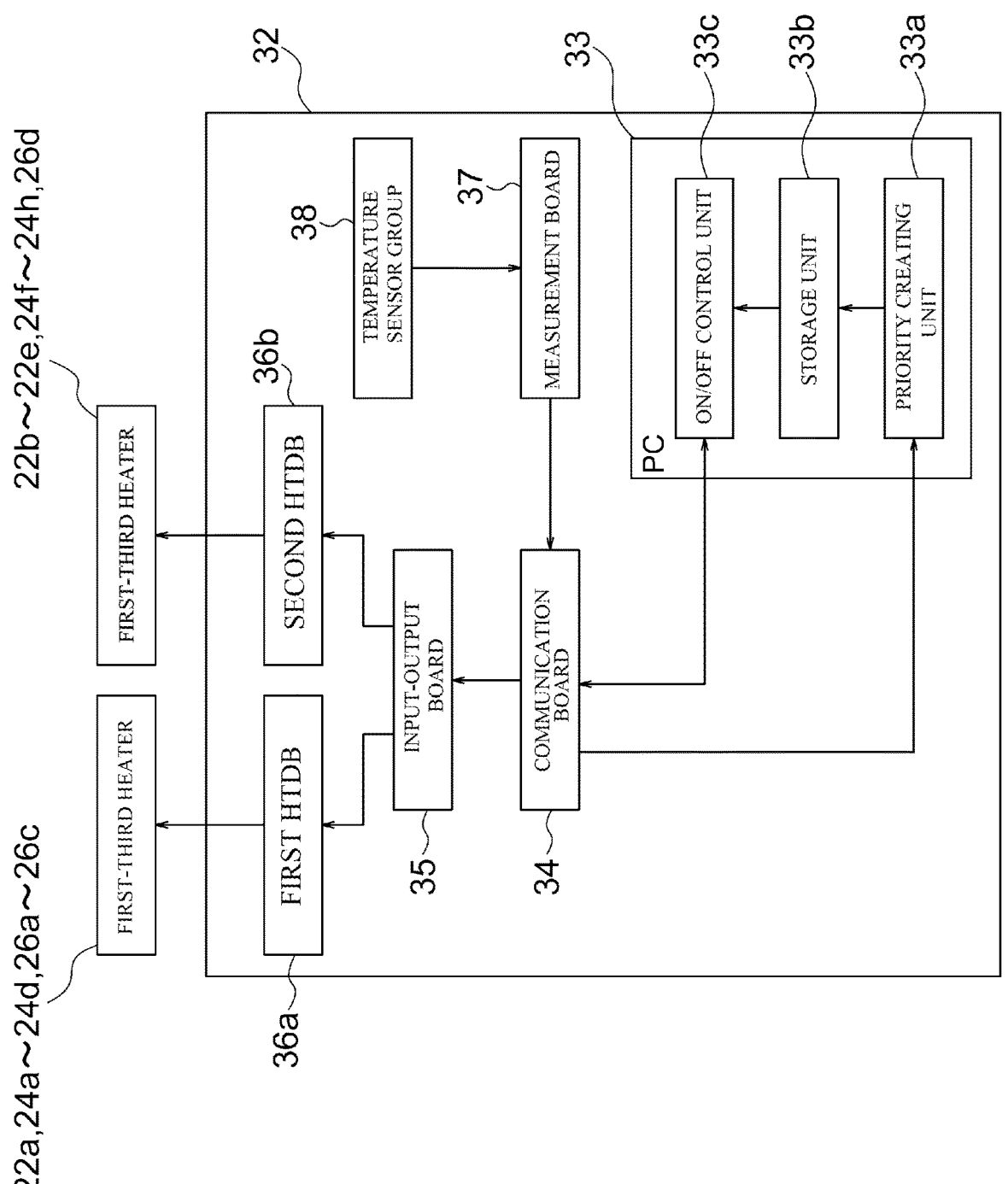

HEATER DRIVE CONTROLLING APPARATUS, ELECTRONIC COMPONENT HANDLING APPARATUS, ELECTRONIC COMPONENT TESTING APPARATUS, AND HEATER DRIVE CONTROLLING METHOD

BACKGROUND

Technical Field

The present invention relates to a heater drive controlling apparatus, an electronic component handling apparatus, an electronic component testing apparatus, and a heater drive controlling method.

Description of Related Art

An electronic component testing apparatus includes a chamber unit (e.g., see Patent Document 1). This chamber unit includes a soak chamber, a test chamber, and an unsoak chamber. The soak chamber is a thermostatic chamber that applies the desired high or low temperature thermal stress to the DUT loaded in the test tray. The test chamber is a measurement unit that brings the DUT in a state of thermal stress applied in the soak chamber into contact with a test head. The unsoak chamber is a heat removal tank that removes the applied heat stress from the DUT tested in the measurement unit.

PATENT DOCUMENT

PATENT DOCUMENT 1: JP 2014-016258 A

In the chamber unit of the electronic component testing apparatus described above, generally, a plurality of heaters for adjusting the temperature in each of the chambers are provided. However, when turning on the heaters at the same time to make the temperature in each of the chambers to target temperatures, a maximum value (a peak electric current) of the sum of the electric currents supplied to each of the heaters increase. To cope with this, it is necessary to increase a rated current of a breaker, then a power supply system of the breaker or the like becomes large.

On the other hand, after the temperature in each of the chambers are raised to the target temperatures, since the electric current required to maintain the target temperatures is small compared to the electric current required to raise the temperatures, the power supply system is not utilized effectively in most of the operating time of the electronic component testing apparatus.

SUMMARY

One or more embodiments provide a heater drive controlling apparatus, an electronic component handling apparatus, an electronic component testing apparatus, and a heater drive controlling method, capable of optimizing the size of the power supply system and effectively utilizing the electric system.

[1] One or more embodiments provide a heater drive controlling apparatus for an electronic component testing apparatus with a test chamber, a thermal-stress applying chamber, and an thermal-stress removing chamber with heaters inside. The heater drive controlling apparatus comprises a controller controlling electric currents supplied from a power source to each of the heaters and a breaker disposed between the power source and the heaters. The controller performs a first drive control to supply the electric currents to the heaters in order according to a first priority set for the heaters so that a sum of the electric currents supplied to the heaters is within a rated current of the breaker.

[2] According to one or more embodiments, in the above heater drive controlling apparatus, the controller may control the heaters in a predetermined cycle. For each of the predetermined cycles, the controller may compare the rated current with the sum of line currents calculated from a power of the heaters to be turned on. The controller may perform the first drive control when the sum of the line currents is greater than the rated current.

[3] According to one or more embodiments, in the above heater drive controlling apparatus, the power source may be a three phase AC power source, the line currents may include three phase line currents $I_R$, $I_S$, $I_T$, and the controller may supply the electric currents to the heaters in the first drive control so that three phase line currents $I_R$, $I_S$, $I_T$ are balanced.

[4] According to one or more embodiments, in the above heater drive controlling apparatus, the first priority may be set based on a second priority set for each of the test chamber, the thermal-stress applying chamber, and the thermal-stress removing chamber.

[5] According to one or more embodiments, in the above heater drive controlling apparatus, the controller may comprise a changing portion changing the first priority. The electronic component testing apparatus may comprise contact units with the test chamber, the thermal-stress applying chamber, and the thermal-stress removing chamber. The changing portion may change the first priority based on a third priority set for each of the contact units.

[6] According to one or more embodiments, in the above heater drive controlling apparatus, the controller may comprise a changing portion changing the first priority and temperature sensors disposed in the test chamber, the thermal-stress applying chamber, and the thermal-stress removing chamber. The controller may calculate temperature differences between a target temperature and temperatures in the test chamber, the thermal-stress applying chamber, and the thermal-stress removing chamber. The changing portion may change the first priority according to the temperature differences.

[7] According to one or more embodiments, in the above heater drive controlling apparatus, the heaters may comprise a first heater; and a second heater having the first priority set lower than the first priority of the first heater. In the first drive control, the controller may supply the electric current to the first heater, then reduces the electric current supplied to the first heater, and then supplies the electric current to the second heater.

[8] According to one or more embodiments, an electronic component handling apparatus may comprise a heater drive controlling apparatus according to one or more embodiments.

[9] According to one or more embodiments, an electronic component testing apparatus may comprise a heater drive controlling apparatus according to one or more embodiments.

[10] One or more embodiments provide a heater drive controlling method for controlling heaters disposed in a test chamber, a thermal-stress applying chamber, and an thermal-stress removing chamber of an electronic component testing apparatus. The heater drive controlling method comprises a first drive control step for supplying electric currents to the heaters in order according to a first priority set for the heaters so that a sum of the electric currents supplied to the heaters is within a rated current of a breaker.

According to one or more embodiments, because the controller performs the first drive control to supply the electric currents to the heaters in order according to the first priority set for the heaters so that the sum of the electric currents supplied to the heaters is within a rated current of the breaker, it is possible to optimize the power supply system and effectively utilize the electric system.

BRIEF DESCRIPTION OF THE DRAWINGS

FIG. 2 is a block diagram illustrating a controller in accordance with one or more embodiments.

DESCRIPTION OF THE EMBODIMENTS

Figure 1:
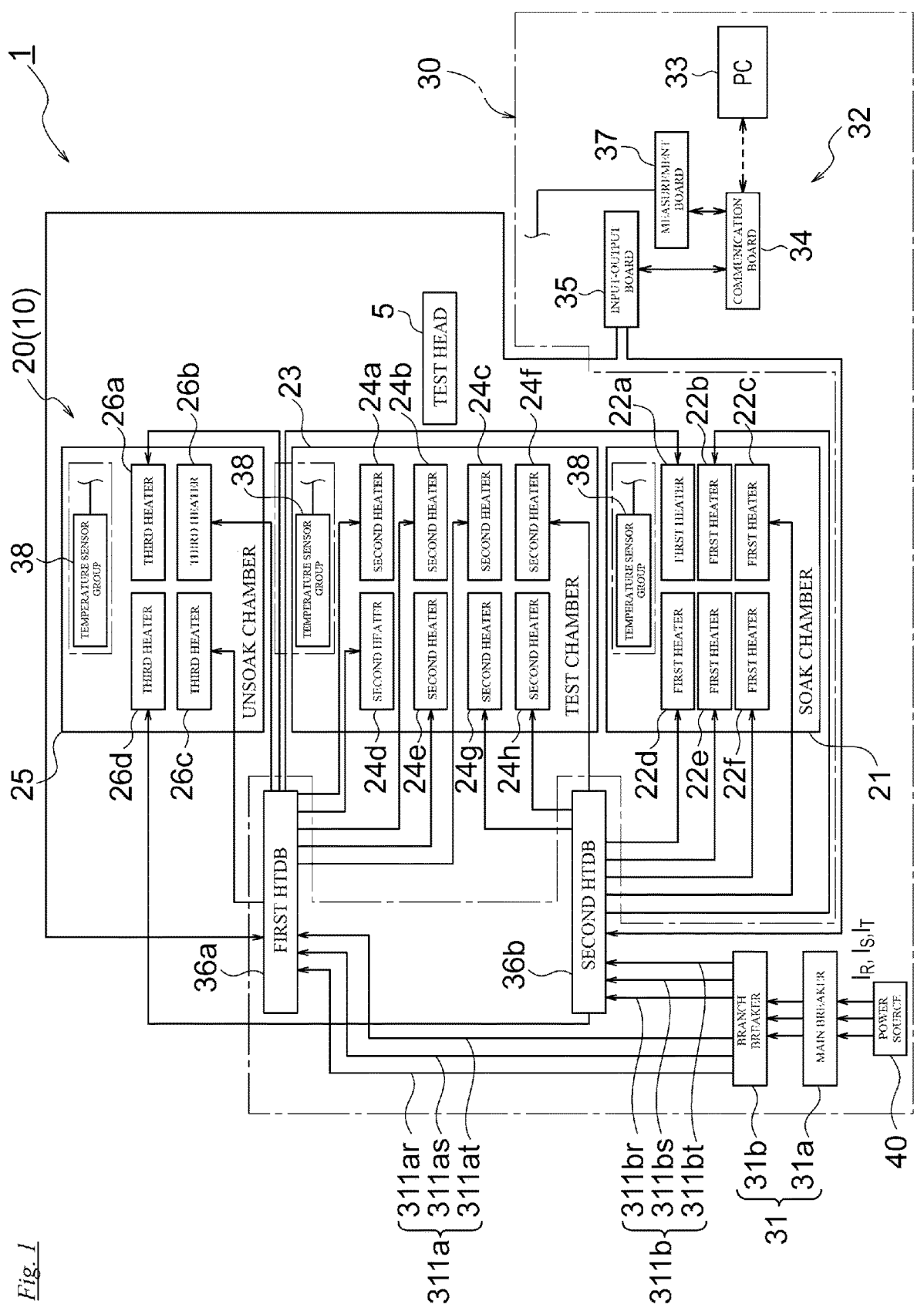
FIG. 1 is a block diagram illustrating an electronic component testing apparatus in accordance with one or more embodiments.

One or more embodiments relate to a heater drive controlling apparatus for controlling a driving of heaters provided in the electronic component testing apparatus for testing the electronic component (DUT: Device Under Test) such as a semiconductor integrated circuit device. One or more embodiments also relate to an electronic component handling apparatus and an electronic component testing apparatus comprising the heater drive control device, and a heater drive controlling method. Hereinafter, embodiments will be described with reference to the drawings. FIG. 1 is a block diagram illustrating an electronic component testing apparatus 1 in accordance with one or more embodiments.

The electronic component testing apparatus 1 in one or more embodiments is an apparatus that tests an electric properties of the DUT (not shown) in a state of applying a thermal stress of high temperature or low temperature to the DUT, or in a state of normal temperature, and classifies the DUT according to the test result. Specific examples of the DUT to be tested are not particularly limited, a memory-based device, a logic-based device, and a SoC (System on a chip) are exemplified.

The electronic component testing apparatus 1 comprises a test head 5, a handler 10, and a heater drive controlling apparatus 30. The handler 10 in one or more embodiments corresponds to an example of "an electronic component handling device" in one or more embodiments.

The test head 5 is a unit that electrically connects the DUTs and a tester (not shown) that performs testing of the DUTs. The test head 5 comprises sockets (not shown). The sockets contact the DUTs, the DUTs and the tester are electrically connected. The test head 5 is not particularly limited, but specifically, the test head described in JP 2022-21239 A or the test head described in JP 2014-016258 A are exemplified.

The handler 10 comprises a contact unit 20. The contact unit 20 conveys the DUT to a contact position where the DUT is brought into contact with the test head 5, and retracts the DUT from the contact position after the test. The contact unit 20 also adjusts the temperature of the DUT to an appropriate temperature. The test head 5 is not particularly limited, but specifically, the contact unit described in JP 2022-21239 A is exemplified.

Although not shown in the figures, the handler 10 comprises a load unit for transporting the DUT to the contact unit 20 and an unload unit for carrying out the DUT from the contact unit 20 after testing.

The contact unit 20 comprises a soak chamber 21, first heaters 22a-22f, a test chamber 23, second heaters 24a-24h, an unsoak chamber 25, and third heaters 26a-26d. In the contact unit described in JP 2022-21239 A described above, each of the chambers are arranged along the vertical direction, but is not limited thereto. As in the handler described in JP 2014-016258 A, each of the chambers may be arranged along the horizontal direction. The soak chamber in one or more embodiments corresponds to an example of "a thermal-stress applying chamber" and the unsoak chamber in one or more embodiments corresponds to an example of "a thermal-stress removing chamber."

The soak chamber 21 is a thermostatic chamber for preheating the DUT prior to the test. Note that "preheating" does not mean only to heat the DUT by applying heat to the DUT, it is also included in the preheating to cool the DUT by applying cold heat to the DUT.

Inside the soak chamber 21, the plurality (six in one or more embodiments) of the first heaters 22a-22f are provided. The first heaters 22a-22f adjusts the temperature inside the soak chamber 21 to a first target temperature which is the temperature required for preheating. The details will be described later, in one or more embodiments, the first heaters 22a-22f are not switched from off to on at the same timing, they are switched on in order.

The test chamber 23 is a thermostatic chamber for maintaining the temperature of the DUT to a second target temperature which is the test temperature. The DUT after being preheated in the soak chamber 21 is transferred to the testing chamber 23. Inside the test chamber 23, a section near the socket of the test head 5 is housed, and inside the test chamber 23, the DUT contacts the socket and the DUT is tested under predetermined temperature conditions. Incidentally, the soak chamber 21 and the test chamber 23 may be composed of one chamber.

Inside the test chamber 23, the plurality (eight in one or more embodiments) of the second heaters 24a-24h are disposed. The second heaters 24a-24h adjusts the temperature inside the test chamber 23 to the second target temperature. In one or more embodiments, the second heaters 24a-24h are also not switched from off to on at the same timing, they are switched on in order.

The unsoak chamber 25 is a thermostatic chamber for heat removal from the DUT after the test. Incidentally, "heat removal" does not only mean lowering the temperature of the DUT to the normal temperature by applying cold heat to the DUT, but also raising the temperature of the DUT to normal temperature by applying warm heat to the DUT (i.e., excluding cold heat) is included in "heat removal".

Inside the unsoak chamber 25, the plurality (four in one or more embodiments) of the third heaters 26a-26d are disposed. The third heaters 26a-26d adjust the temperature in the unsoak chamber 25 to a third target temperature required for heat removal. In one or more embodiments, the third heaters 26a-26d are also not switched from off to on at the same timing, they are switched on in order.

The number of the first to third heaters 22a-26c is not particularly limited, and is changed according to the designs of the contact unit 20.

The heater drive controlling apparatus 30 comprises a breaker unit 31, a controller 32. The breaker unit 31 in one or more embodiments comprises a main breaker (BCU) 31a, a branch breaker (ACU) 31b₁, a first wiring group 311a, a second wiring group 311b.

The main breaker 31a is electrically connected to the power source 40. The power source 40 is a three-phase AC power source, can supply three-phase line currents $I_R$, $I_S$, $I_T$ toward the main breaker 31a. The main breaker 31a has a predetermined rated current, the sum of the current value of the line currents $I_R$, $I_S$, $I_T$ supplied from the power source 40 ($I_R+I_S+I_T$) is limited to the rated current of the main breaker 31a or less.

The branch breaker 31b is electrically connected to the main breaker 31a. With the branch breaker 31b, the line current supplied from the main breaker 31a is distributed to two systems, and the line currents are distributed to the first wiring group 311a or the second wiring group 311b. The branch breaker 31b has a predetermined rated current for the first wiring group 311a, and a predetermined rated current for the second wiring group 311b.

This branch breaker 31b is electrically connected to the first heater driver board (HTDB) 36a and the second heater driver board (HTDB) 36b described below, and the distributed line currents are supplied to the first HTDB 36a or the second HTDB 36b. The first wiring group 311a is interposed between the branch breaker 31b and the first HTDB 36a, electrically connects the branch breaker 31b to the first HTDB 36a. The first wiring group 311a according to one or more embodiments comprises a wiring 311ar for the line current $I_R$, a wiring 311as for the line current $I_S$, and a wiring 311at for flowing a line current IT.

Similarly, the second wiring group 311b is interposed between the branch breaker 31b and the second HTDB 36b, electrically connects the branch breaker 31b to the second HTDB 36b. The second wiring group 311b in one or more embodiments comprises a wiring 311br for the line current $I_R$, a wiring 311b s for the line current $I_S$, and a wiring 311bt for the line current IT.

FIG. 2 is a block diagram illustrating the controller 32 in one or more embodiments. As shown in FIG. 2, the controller 32 controls the electric current supplied from the power source 40 to the first to third heaters 22a-26d. The controller 32 performs a first drive control to supply the electric currents to the first to third heaters 22a-26d in sequence according to the first priority (a degree of priority) set for the first to third heaters 22a-26d so that the sum of the electric currents supplied to the first to third heaters 22a-26d is within the rated current of the breaker 31. The first priority will be described later.

The controller 32 comprises a PC (Personal Computer) 33, a communication board 34, an input-output board 35, the first and second HTDBs 36a, 36b, the measurement board 37, and a plurality of temperature sensors 38 (temperature sensor group 38).

The PC 33 is, for example, a computer including a CPU, ROM and a RAM and the like, but not limited to, industrial PC (FAPC) and the like. The PC 33 comprises a priority creating unit 33a, a storage unit 33b, and an on/off control unit 33c.

The priority creating unit 33a in one or more embodiments is the portion where the first priority is manually entered by the operator. That is, the operator can manually set and change the first priority in the priority creating unit 33a via the user interface or the like of the PC 33. The priority creating unit 33a outputs the set first priority to the storage unit 33b. The first priority may be automatically set and changed, for example, by software or the like installed in the PC 33. The priority creating unit 33a according to one or more embodiments corresponds to an example of "a changing unit."

The storage unit 33b stores the first priority output from the priority creating unit 33a. The storage unit 33b stores a new first priority newly input from the priority creating unit 33a, if the previously stored first priority exists. The storage unit 33b outputs a signal relating to the first priority to the on/off control unit 33c.

The on/off control unit 33c controls the first to third heaters 22a-22e, 24a-24h, 26a-26d on/off in a predetermined cycle (e.g., every 1 msec). The on/off control unit 33c can communicate with the communication board 34 by wired or wirelessly, and outputs on/off control signals to communication board 34 based on the first priority. The on/off control signals are finally inputted to the triac (triode AC switch) 361b of the first and second HTDBs 36a, 36b to be described later, are for the on/off control of the triac 361.

The on/off control unit 33c, for each of the above cycle, compares the rated current of the main breaker 31a and the sum of the line currents calculated from the power of the heaters to be turned on. Then, the on/off control unit 33c performs the first drive control described later, when the sum of the line currents is greater than the rated current described above. The sum of the line currents may be determined from the phase currents to be described later, for example, in the delta connection, the line currents can be obtained by multiplying the phase currents by the root 3.

Incidentally, the functions of the priority creating unit 33a, the storage unit 22b, and the on/off control unit 33c of the PC 33 of the controller 32 in one or more embodiments may be realized by a CPU or the like incorporated in a circuit board.

The communication board 34 is a circuit board capable of communicating with the PC 33, the input-output board 35, and the measurement board 37. The communication board 34 outputs the on/off control signal inputted from the on/off control unit 33c to the input-output board 35. The communication board 34 may also receive a detected signal described below by the temperature sensors 38 output from the measurement board 37 and output the detected signals to the priority creating unit 33a.

The input-output board 35 is not particularly limited, but is a I/O board. The input-output board 35 transmits the on/off control signals to the first HTDB 36a and the second HTDB 36b.

The first HTDB 36a is a driver board that distributes and supplies the electric currents to the first heaters 22a, the second heaters 24a-24d, and the third heaters 26a-26c. That is, the first HTDB 36a is a driver board for controlling the magnitude of the electric current supplied to each of the heaters.

Figure 3:
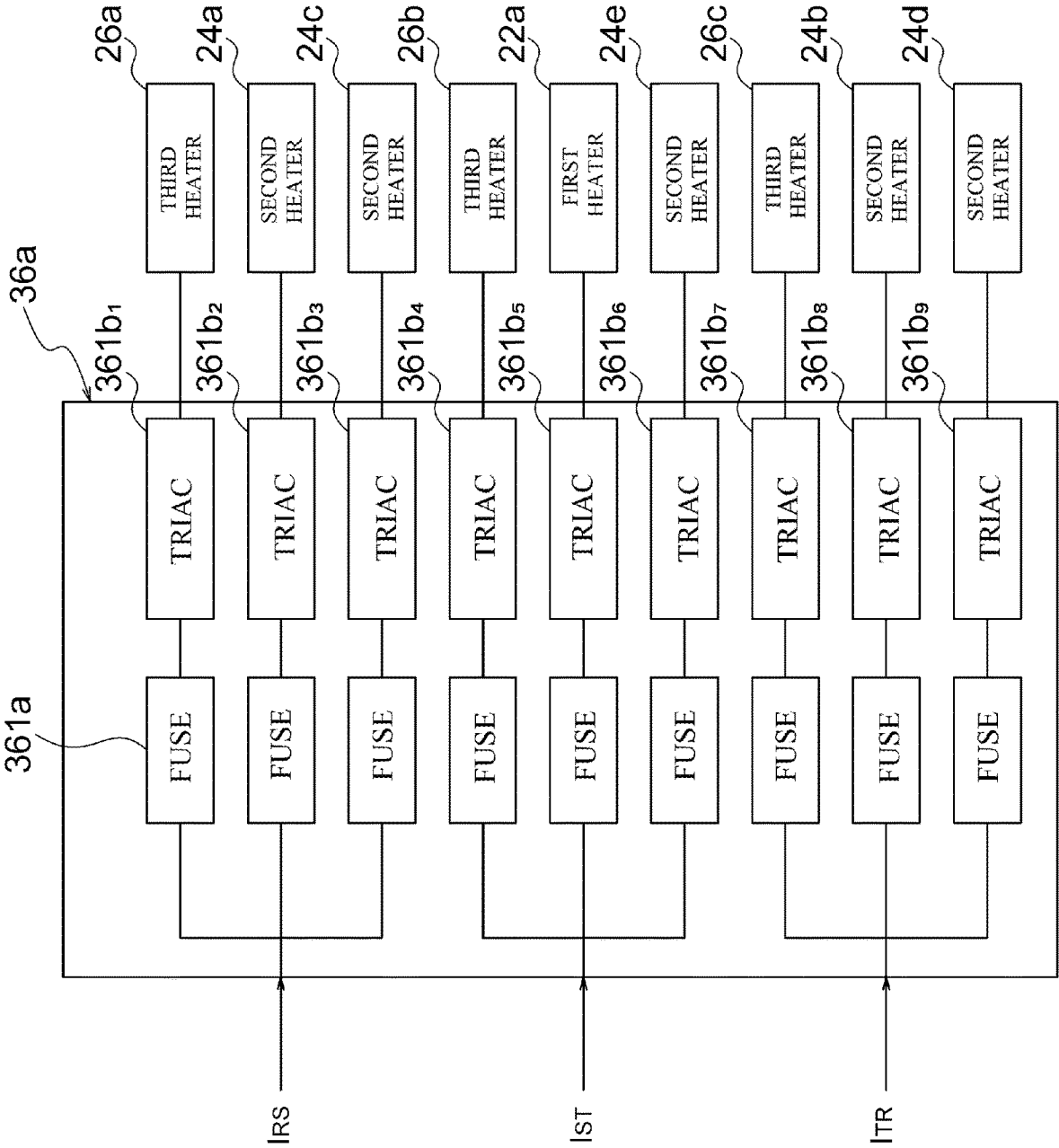
FIG. 3 is a block diagram illustrating a first heater driver board in accordance with one or more embodiments.
Figure 4:
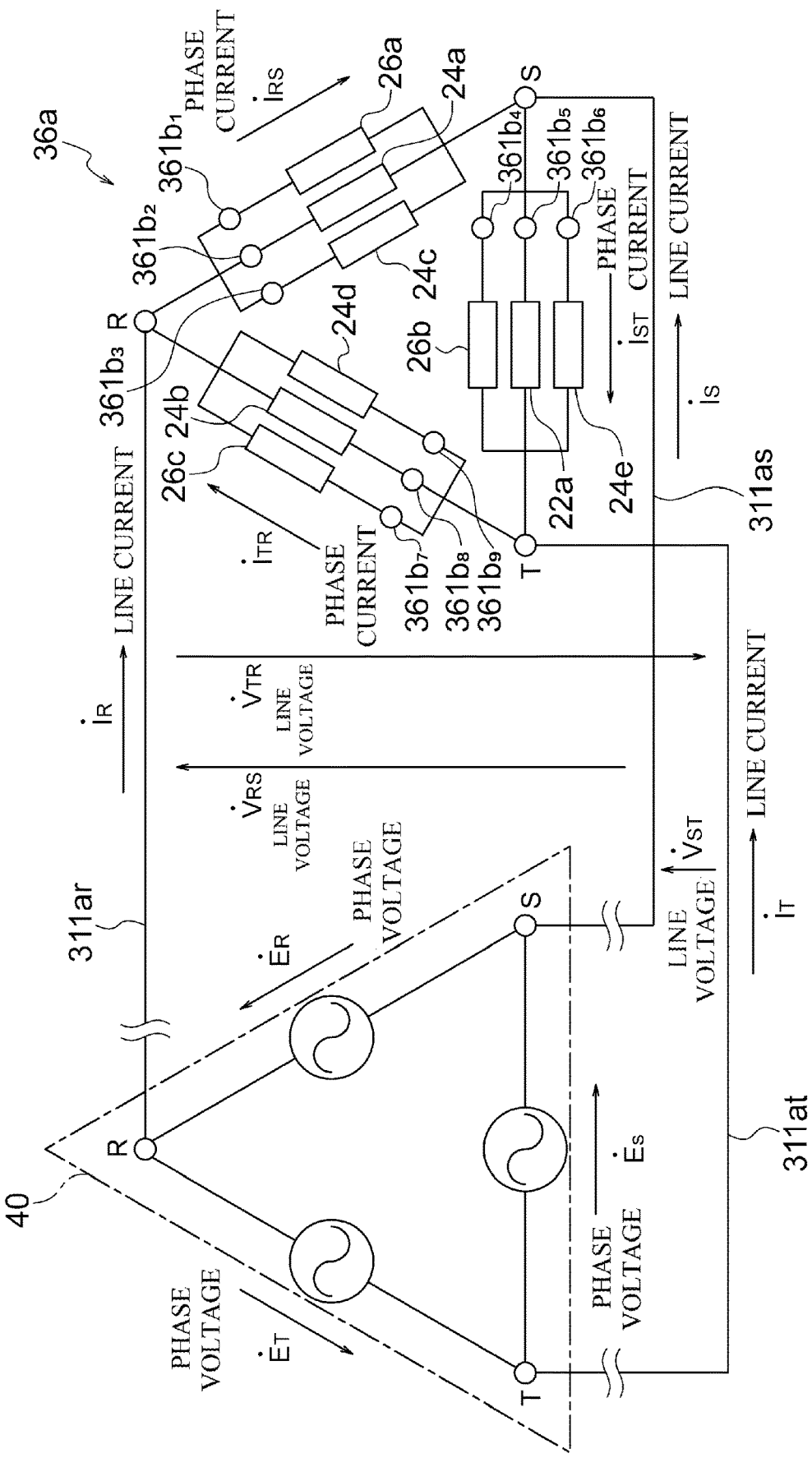
FIG. 4 is a circuit diagram illustrating a power supply, the first wiring group, a first heater driver board, and first to third heaters in accordance with one or more embodiments.

FIG. 3 is a block diagram illustrating the first heater driver board 36a in one or more embodiments. FIG. 4 is a circuit diagram illustrating the power source 40, the first wiring group 311a, the first heater driver board 36a, and the first to third heater 22a, 24a-24d, 26a-26c in one or more embodiments. In the circuit diagram of FIG. 4, the fuses 361a are not illustrated.

As shown in FIG. 3, the first HTDB 36a in one or more embodiments is a circuit-board for distributing the phase currents $I_{RS}$, $I_{ST}$, $I_{TR}$ for nine heaters 22a, 24a-24d, 26a-26c. As shown in FIG. 4, the power source 40, the first wiring group 311a, the first heater driver board 36a, and the first to third heaters 22a, 24a-24d, 26a-26c constitute the delta connection.

As shown in FIG. 3, the first HTDB 36a comprises a plurality (nine in this example) of the fuses 361a and the triacs 361b₁-361b₉ (referred to collectively as a triac 361b, as appropriate) electrically connected to each of the fuses 361a.

The fuse 361a shuts off the circuit when the overcurrent flows into the circuit. Although not particularly limited, as the fuse 361a, a fuse that shut off the circuit when an electric current exceeding 10 A flows may be used. In one or more embodiments, three fuses 361a are electrically arranged in parallel.

The triac 361b is a switch that turns on at zero crossing (zero AC voltage). In one or more embodiments, the triacs 361b are interposed between the fuses 361a and the first to third heaters 22a, 24a-24d, 26a-26c. The triac 361b is on/off controlled by the on/off control signals described above.

More specifically, as shown in FIG. 4, between the load-side RS of the delta connection, three triacs 361b₁-361b₃ which are electrically connected to each other in parallel, and the second and third heaters 24a, 24c, 26a are disposed. Between the load-side ST of the delta connection, three triacs 361b₄-361b₆ electrically connected in parallel to each other, and the first to third heaters 22a, 24e, 26b are disposed. Between the load-side TR of the delta connection, three triacs 361b₇-361b₉ which are electrically connected in parallel to each other, and the second and third heaters 24b, 24d, 26c are arranged.

In this circuit, the first to third heaters 22a, 24a-24d, 26a-26c for supplying the electric currents can be selected by the on/off control of the triacs 361b, and the quantity of the electric currents supplied to the heaters can be controlled. The control of the quantity of the electric currents is not particularly limited, it can be controlled by adjusting the duty ratio.

The second HTDB 36b shown in FIG. 1 also basically has the same structure as the first HTDB 36a. The second HTDBs 36b also comprises a power source 40, a second wiring group 311b, and first to third heaters 22b-22e, 24f-24h, 26d together constitute a delta connection. The controller 32 can select the first to third heaters 22b-22e, 24f-24h, 26d (see FIG. 2) for supplying the electric current by turning on and off the triacs 361b in the second HTDB 36b based on the first priority inputted from the input-output board 35, and can control the quantity of the electric currents supplied to the heaters.

The first HTDB 36a may constitute the Y-connection together with the power source 40, the first wiring group 311a, the first to third heaters 22b-22e, 24f-24h, 26d. Similarly, the second HTDB 36b may also constitute the Y-connection together with the power source 40, the second wiring group 311b, and the first to third heaters 22b-22e, 24f-24h, 26d.

As shown in FIG. 2, the measurement board 37 is a circuit board for receiving detection signals from the temperature sensor group 38. The measurement board 37 outputs the detected temperature by each temperature sensor group 38 to the priority creating unit 33a through the communication board 34.

Although not shown in particular, the temperature sensor group 38 comprises a number (18 in one or more embodiments) of temperature sensors corresponding to the first to third heaters 22a-26d. Each temperature sensor constituting the temperature sensor group 38 is disposed at a position corresponding to each of the first to third heaters 22a-26d and detects the temperature in the vicinity of each heater.

[First Priority]

Figure 5:
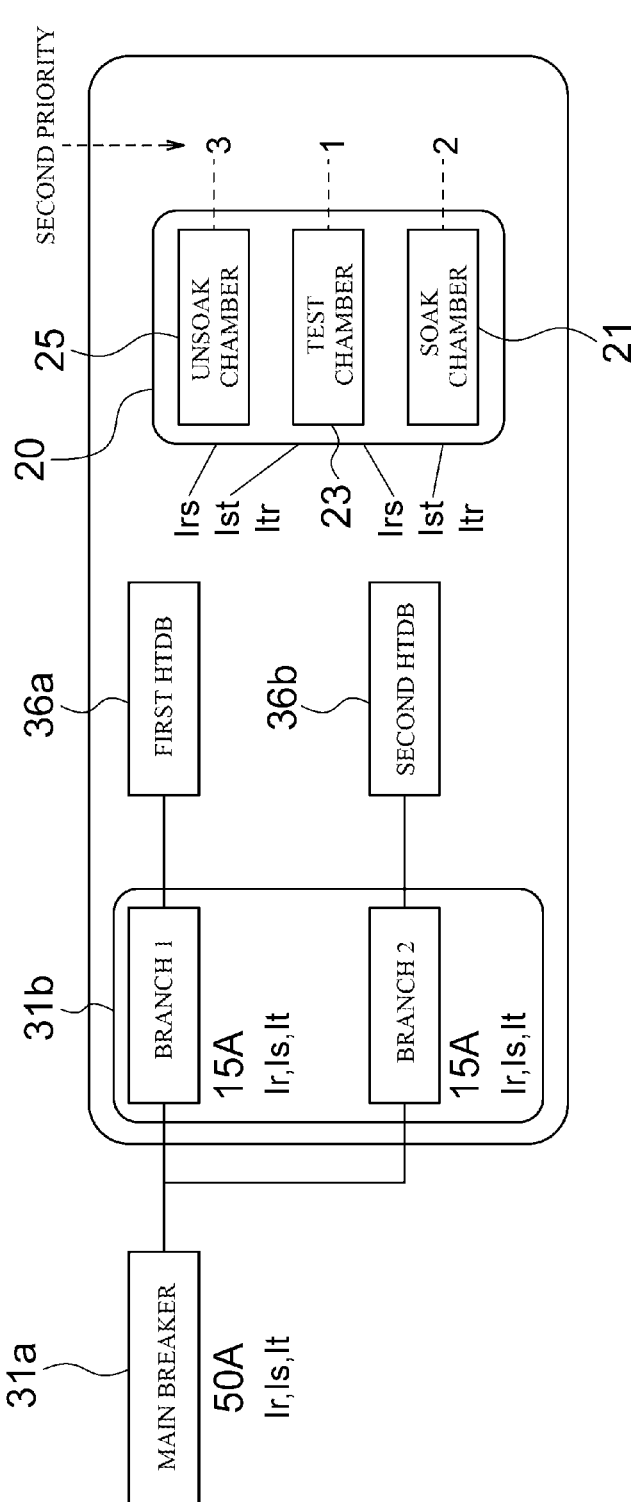
FIG. 5 is an explanatory diagram illustrating a setting of a first priority in accordance with one or more embodiments.

The first priority set for first to third heaters 22a-26d in such a heater drive controlling apparatus 30 will be described with reference to figures. FIG. 5 is an explanatory diagram illustrating setting of the first priority in one or more embodiments.

As shown in FIG. 5, the first priority in one or more embodiments is set based on the second priority set for each chamber. In the priority shown in FIG. 5 and Tables 1, 2 below, the lower number means the higher priority.

Specifically, in the second priority, (Priority 1) the test chamber 23 has the highest priority, (Priority 2) the soak chamber 21 has next highest priority, and (Priority 3) the unsoak chamber has the lowest priority. In other words, the second priority is aimed at completing the temperature rising inside the test chamber 23 with the highest priority, then completing the temperature rising inside the soak chamber 23, and finally completing the temperature rising inside the unsoak chamber 25.

The first priority is set so that the line currents $I_R$, $I_S$, $I_T$ is balanced. Specifically, the quantities of the line currents $I_R$, $I_S$, $I_T$ are controlled so that the differences between the line currents $I_R$, $I_S$, $I_T$ are less than ±20%.

Furthermore, at this time, the line currents $I_R$, $I_S$, $I_T$ are allocated so that the line currents $I_R$, $I_S$, $I_T$ are lower than the rated current of the main breaker 31A (50A as an example) and the rated current of each branch of the branch breaker 31B (15A as an example). Specifically, the line currents $I_R$, $I_S$, $I_T$ are allocated so that the sum of the currents $I_{SOAK}$, $I_{TEST}$, $I_{UNSOAK}$ in FIG. 6 describe below is lower than an upper limit current $I_{LIMIT}$. The upper limit current $I_{LIMIT}$ is lower than the rated current of the main breaker 31a.

The first priority set on the basis of the second priority as described above, for example, can be set to the first priority as shown in Tables 1, 2 below. Table 1 represents the first priority of the heaters to which are supply power via the first HTDB 36a, and Table 2 represents the first priority of the heaters to which are supply power via the second HTDB 36b.

TABLE 1

| First HTDB | Branch | Position | Phase | Maximum Output | First Priority RS | ST | TR |
|---|---|---|---|---|---|---|---|
| Third Heater 26a | 1 | UNSOAK | RS | 1200 W | 4 | | |
| Third Heater 26b | 1 | UNSOAK | ST | 1200 W | | 3 | |

TABLE 1-continued

| First HTDB | Branch | Position | Phase | Maximum Output | First Priority RS | ST | TR |
|---|---|---|---|---|---|---|---|
| Third Heater 26c | 1 | UNSOAK | TR | 1200 W | | | 4 |
| Second Heater 24a | 1 | TEST | RS | 1200 W | 1 | | |
| Second Heater 24b | 1 | TEST | TR | 1200 W | | | 2 |
| Second Heater 24c | 1 | TEST | RS | 360 W | 5 | | |
| Second Heater 24d | 1 | TEST | TR | 333 W | | | 5 |
| First Heater 22a | 1 | SOAK | ST | 1200 W | | 1 | |
| Second Heater 24e | 1 | TEST | ST | 360 W | | 5 | |

TABLE 2

| Second HTDB | Branch | Position | Phase | Maximum Output | First Priority RS | ST | TR |
|---|---|---|---|---|---|---|---|
| Second Heater 24f | 2 | TEST | TR | 1200 W | | | 1 |
| Second Heater 24g | 2 | TEST | RS | 1200 W | 2 | | |
| First Heater 22b | 2 | SOAK | RS | 1200 W | 3 | | |
| First Heater 22c | 2 | SOAK | ST | 1200 W | | 2 | |
| First Heater 22d | 2 | SOAK | TR | 1200 W | | | 3 |
| First Heater 22e | 2 | SOAK | RS | 360 W | 6 | | |
| First Heater 22f | 2 | SOAK | TR | 333 W | | | 6 |
| Third Heater 26d | 2 | UNSOAK | ST | 1200 W | | 4 | |
| Second Heater 24h | 2 | TEST | ST | 360 W | | 6 | |

[First Drive Controlling Method]

Figure 6:
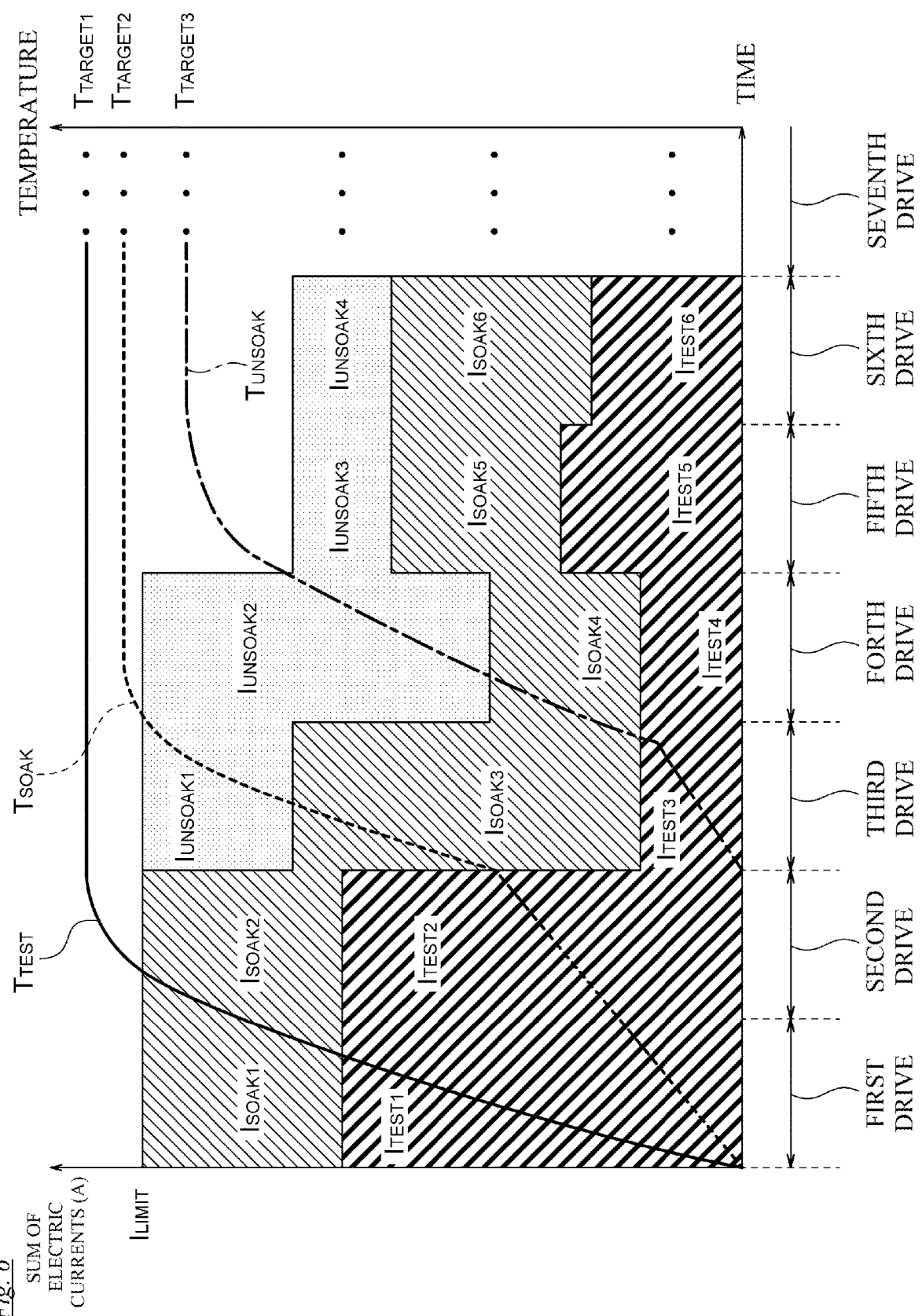
FIG. 6 is a graph illustrating the first drive control by the heater drive controlling apparatus in accordance with one or more embodiments.

The first drive controlling method of the heater based on the first priority as shown in Tables 1, 2 above will be described with reference to figures. FIG. 6 is a graph illustrating the first drive control by the heater drive controlling apparatus 30 in the one or more embodiments.

Incidentally, in FIG. 6, $I_{SOAK}$ is the sum of the electric currents supplied to the first heaters 22a-22f disposed in the soak chamber 21. $I_{TEST}$ is the sum of the electric currents supplied to the second heaters 24a-24f disposed in the test chamber 23. $I_{UNSOAK}$ is the sum of the electric currents supplied to the third heaters 26a-26d disposed in the unsoak chamber 25.

Further, in FIG. 6, the solid line $T_{SOAK}$ shows the temperature change of the inside of the soak chamber 21, the broken line $T_{TEST}$ shows the temperature change of the inside of the test chamber 23, the alternate long and short dash line $T_{UNSOAK}$ shows the temperature change of the inside of the unsoak chamber 25.

In the first priority as shown in Tables 1, 2, first, the phase currents $I_{RS}$, $I_{TR}$ are supplied to the second heaters 24a, 24f set to Priority 1 in Table 1, 2, and the phase current IST is supplied to the first heater 22a (first drive of FIG. 6). That is, two phases currents of the three-phase currents are used to raise the temperature in the test chamber 23, one phase current is used to raise the temperature in the soak chamber 21 (first temperature raising drive).

At this time, the second heaters 24a, 24f and the first heater 22a may be driven at the highest power (1200 W in one or more embodiments). Here, as shown in FIG. 6, the sum of $I_{TEST}$ and $I_{SOAK}$ when the second heaters 24a, 24f and the first heater 22a are driven at the highest power in the first drive is LIMIT ($I_{SOAK1}+I_{TEST1}=I_{LIMIT}$).

In this first drive, as shown in FIG. 6, $I_{TEST1}$ is larger than $I_{SOAK1}$ ($I_{TEST1}>I_{SOAK1}$), the ratio of $I_{TEST1}$ and $I_{SOAK1}$ is 2:1 ($I_{TEST1}:I_{SOAK1}=2:1$). In this way, the inside of the test chamber 23 is heated with the highest priority, and the inside of the soak chamber 21 is heated with the next priority.

Then, after the temperatures of the vicinities of the second heaters 24a, 24f and the first heater 22a reaches the predetermined temperature, the electric currents supplied to the second heaters 24a, 24f and the first heater 22a are reduced (first heat insulation drive). The amount of the currents supplied to the second heaters 24a, 24f and the first heater 22a may be any amount that can maintain the predetermined temperature.

Simultaneously with the first heat insulation drive, the phase current $I_{RS}$, $I_{TR}$ are supplied to the second heaters 24b, 24g set to the priority 2 in Tables 1, 2, and the phase current IST is supplied to the first heater 22c (second drive in FIG. 6). Also in this second drive, similarly to the first drive, two phase currents of the three-phase currents are used to raise the temperature inside the test chamber 23, one phase current is used to raise the temperature inside the soak chamber 21 (second temperature raising drive). As shown in FIG. 6, the first and second drives cause the temperature inside the test chamber 23 to first reach the target temperature $T_{TARGET1}$.

After the temperature in the test chamber 23 reaches the target temperature $T_{Target1}$, the electric currents supplied to the second heaters 24a-24f are reduced (second thermal insulation drive). Then, the phase currents $I_{RS}$, $I_{TR}$ are supplied to the first heaters 22b, 22d set to Priority 3 in Tables 1, 2, and the phase current IRS is supplied to the third heater 26b (third drive in FIG. 6). That is, in the third drive, simultaneously with the first and second heat insulation drive, the third temperature raising drive is performed by the first heaters 22b, 22d and the third heater 26b.

As shown in FIG. 6, in the third drive, the inside of the soak chamber 21 is heated by two first heaters 22b, 22d and the inside of the unsoak chamber 25 is heated by one third heater 26b by using a margin. The margin is calculated by subtracting the electric current $I_{TEST3}$ required by the second heaters 24a-24f to maintain the target temperature $T_{TARGET1}$ from the upper limit current $I_{LIMIT}$ ($I_{LIMIT}-I_{TEST3}=I_{SOAK3}+$ $I_{UNSOAK1}$). In this third drive, as shown in FIG. 6, $I_{SOAK3}$ is larger than $I_{UNSOAK1}$ ($I_{SOAK3}>I_{UNSOAK1}$), the ratio of $I_{SOAK3}$ and $I_{UNSOAK1}$ is 2:1 ($I_{SOAK3}:I_{UNSOAK1}=2:1$).

After the temperature inside the soak chamber 21 reaches the target temperature $T_{TARGET2}$ by the third drive and the temperatures of the vicinities of the third heater 26*b* reaches the predetermined temperature, the electric current supplied to the first heaters 22*b*, 22*d* and the third heater 26*b* is reduced (third heat insulation drive), and the phase current $I_{RS}$, $I_{ST}$, $I_{TR}$ is supplied to the third heaters 26*a*, 26*c*, 26*d* set to the priority 4 of Tables 1, 2 (fourth drive of FIG. 6). That is, in the fourth drive, with the first to third heat insulation drives, the fourth temperature raising drive is performed by the third heaters 26*a*, 26*c*, 26*d*.

As shown in FIG. 6, in the fourth drive, a margin is used to drive the three third heaters 26*a*, 26*c*, and 26*d* to raise the temperatures in the vicinities of the three third heaters 26*a*, 26*c*, 26*d* to the predetermined temperature. The margin is calculated by subtracting the electric current ($I_{TEST4}$+$I_{SOAK4}$) required by the first and second heaters 22*b*, 22*d*, 24*a*-24*f* to maintain the target temperature $T_{TARGET1}$, $T_{TARGET2}$ from the upper limit current $I_{LIMIT}$ ($I_{LIMIT}$−($I_{TEST4}$+$I_{SOAK4}$)=$I_{UNSOAK2}$). As a result, the temperature inside the unsoak chamber 25 reaches the target temperature $T_{TARGET3}$ by raising the vicinities of the third heaters 26*a*-26*d* to the predetermined temperature.

After the temperature inside the unsoak chamber 25 reaches the target temperature $T_{TARGET3}$ by the fourth drive, the electric current supplied to the third heaters 26*a*, 26*c*, 26*d* are reduced (fourth heat insulation drive), and the phase currents $I_{RS}$, $I_{ST}$, $I_{TR}$ are supplied to the second heaters 24*c*-24*e* set to the priority 5 of Tables 1, 2 with lower power (fifth drive of FIG. 6). That is, in the fifth drive, with the first to fourth heat insulation drives, the fifth temperature raising drive is performed by the second heaters 24*c*-24*e* having smaller output.

In one or more embodiments, since the outputs of the second heaters 24*c*-24*e*, 24*h* and the first heaters 22*e*, 22*f* are relatively small, exceptionally, the first priorities of these heaters are set lower than the heaters having larger output. That is, the heaters with smaller output are turned on later than the heaters with larger output.

However, among the heaters with smaller output, the first priorities of the second heaters 24*c*-24*e* disposed in the test chamber 23 is set higher than the first priorities of the first heaters 22*e*, 22*f* disposed in the soak chamber 21.

After the temperatures of the vicinities of the second heaters 24*c*-24*e* reach the predetermined temperature, the electric current supplied to the second heaters 24*c*-24*e* are reduced (fifth heat insulation drive), and the phase currents $I_{RS}$, $I_{TR}$ are supplied to the first heaters 22*e*, 22*f* set to the priority 6 in Tables 1, 2, and the phase current $I_{ST}$ is supplied to the remaining second heater 24*h* (sixth drive in FIG. 6). That is, in the sixth drive, with the first to fifth heat insulation drive, the sixth temperature raising drive is performed by the first heaters 22*e*, 22*f* and the second heater 24*h* with smaller output.

Finally, after the temperatures of vicinities of the first heaters 22*e*, 22*f* and the second heater 24*h* are raised to the predetermined temperature, by the heat insulation drives of all first to third heaters 22*a*-22*f*, 24*a*-24*h*, 26*a*-26*d*, the temperatures inside the chambers 21, 23, 25 are maintained (the seventh drive of FIG. 6). As described above, the first drive control method is executed.

The first priority shown in Tables 1, 2 are set according to the type of the chamber in which the heaters are disposed, but is not limited thereto. For example, the first priority may be set according to the outputs of the heaters, or may be set based on other indicators such as importance of place inside the chamber.

The first priority may also be changed as follows. That is, the first temperature difference between the detected temperature inside the test chamber 23 and the target temperature $T_{TARGET1}$ detected by the above-described temperature sensor is calculated, the second temperature difference between the detected temperature inside the soak chamber 21 and the target temperature $T_{TARGET2}$ is calculated, and the third temperature difference between the detected temperature inside the unsoak chamber 25 and the target temperature and $T_{TARGET3}$ is calculated. The first priority may be changed based on the first to third temperature differences.

In this case, as illustrated in FIG. 2, the detected values detected by the temperature sensors included in the temperature sensor group 38 are inputted to the priority creating unit 33*a* of the PC 33 through the measurement board 37 and the communication board 34. Then, in the priority creating unit 33*a*, the first to third temperature differences are calculated, and the first priority is changed based on the first to third temperature differences. More specifically, by identifying the chamber having the largest temperature difference from the target temperature on the basis of the first to third temperature differences and increasing the first priority of the heaters disposed in the chamber, the chamber having the large deviation from the target temperature can be preferentially heated.

Further, in one or more embodiments, although the electronic component testing apparatus 1 comprising only one contact unit 20 is illustrated, in the electronic component testing apparatus comprising a plurality of contact units 20, the first priority may be changed based on the third priority set for each contact unit 20.

Figure 7:
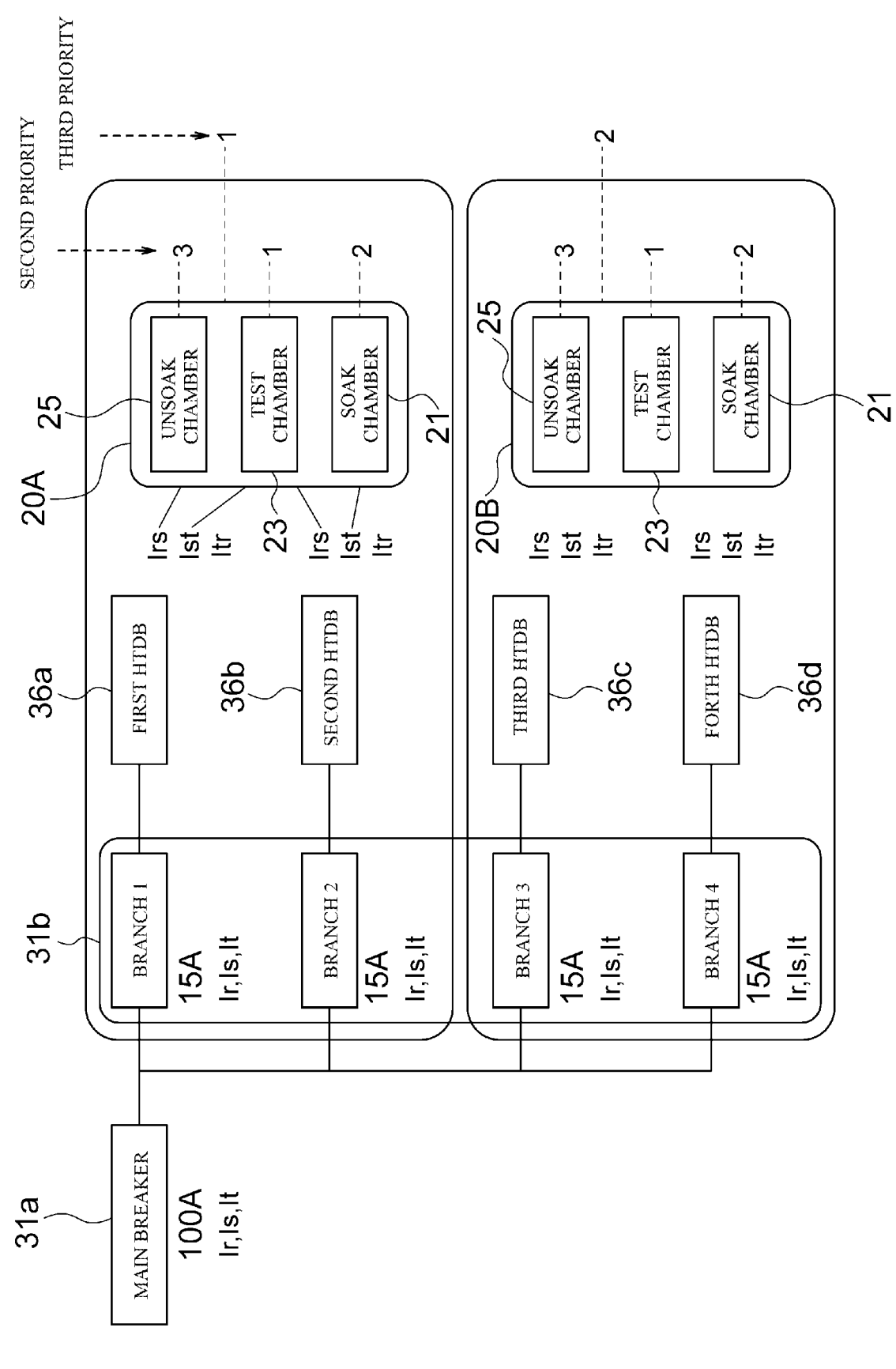
FIG. 7 is an explanatory diagram illustrating a method for changing the first priority based on the third priority in an electronic component testing apparatus including contact units in accordance with one or more embodiments.

FIG. 7 is an explanatory diagram illustrating a method for changing the first priority based on the third priority in the electronic component testing apparatus 1 including contact units in one or more embodiments. Although the electronic component testing apparatus 1 comprising two contact units 20 is illustrated, the electronic component testing apparatus 1 may comprise three or more contact units 20.

Both the first and second contact unit 20A, 20B shown in FIG. 7 have the same structure as the contact unit 20 shown in FIG. 1. In this case, as shown in FIG. 7, the heater drive controlling apparatus 30 further comprises a third and fourth HTDBs 36*c*, 36*d* for controlling the driving of the heaters of the second contact unit 20B in addition to the first and second HTDBs 36*a*, 36*b* for controlling the driving of the heaters of the first contact unit 20A. Then, the branch breaker 31*b* further includes branches 3 and 4 connected to these third and fourth HTDBs 36*c*, 36*d*, respectively.

The first priority similar to Tables 1, 2 above is basically set for the heaters of the first and second contact units 20A, 20B. However, as shown in FIG. 7, the first priority may be changed on the basis of the third priority set for each first contact unit 20A, 20B.

For example, as shown in FIG. 7, when the third priority of the first contact unit 20A is higher than the third priority of the second contact unit 20B, the temperature raising in the soak chamber 21, the test chamber 23, and the unsoak chamber 24 of the second contact unit 20B is started after the temperature raising in the soak chamber 21, the test chamber 23, and the unsoak chamber 24 of the first contact unit 20A is completed.

Thus, the first priorities set for the heaters of the contact units 20A, 20B can be common. Therefore, even when the electronic component testing device 1 includes a plurality of contact units 20A, 20B, circuit designing is facilitated.

Further, for example, when one of the second contact unit 20B recovers from the failure, the third priority of the second contact unit 20B is increased. Thus, the speed of return of the temperature in the chambers of the second contact unit 20B can be increased.

As described above, in the heater drive controlling method by the heater drive controlling apparatus according to one or more embodiments, the controller 30 performs the first drive control for supplying electric currents to the first to third heaters 22*a*-22*f*, 24*a*-24*h*, 26*a*-26*d* in order according to the first priority set for the first to third heater 22*a*-22*f*, 24*a*-24*h*, 26*a*-26*d* so that the sum of the electric currents supplied to the first to third heaters 22*a*-22*f*, 24*a*-24*h*, 26*a*-26*d* is within the range of the rated current of the breaker. Therefore, as shown in FIG. 6, the size of the power supply system can be optimized because the peak current does not become too large.

Figure 8:
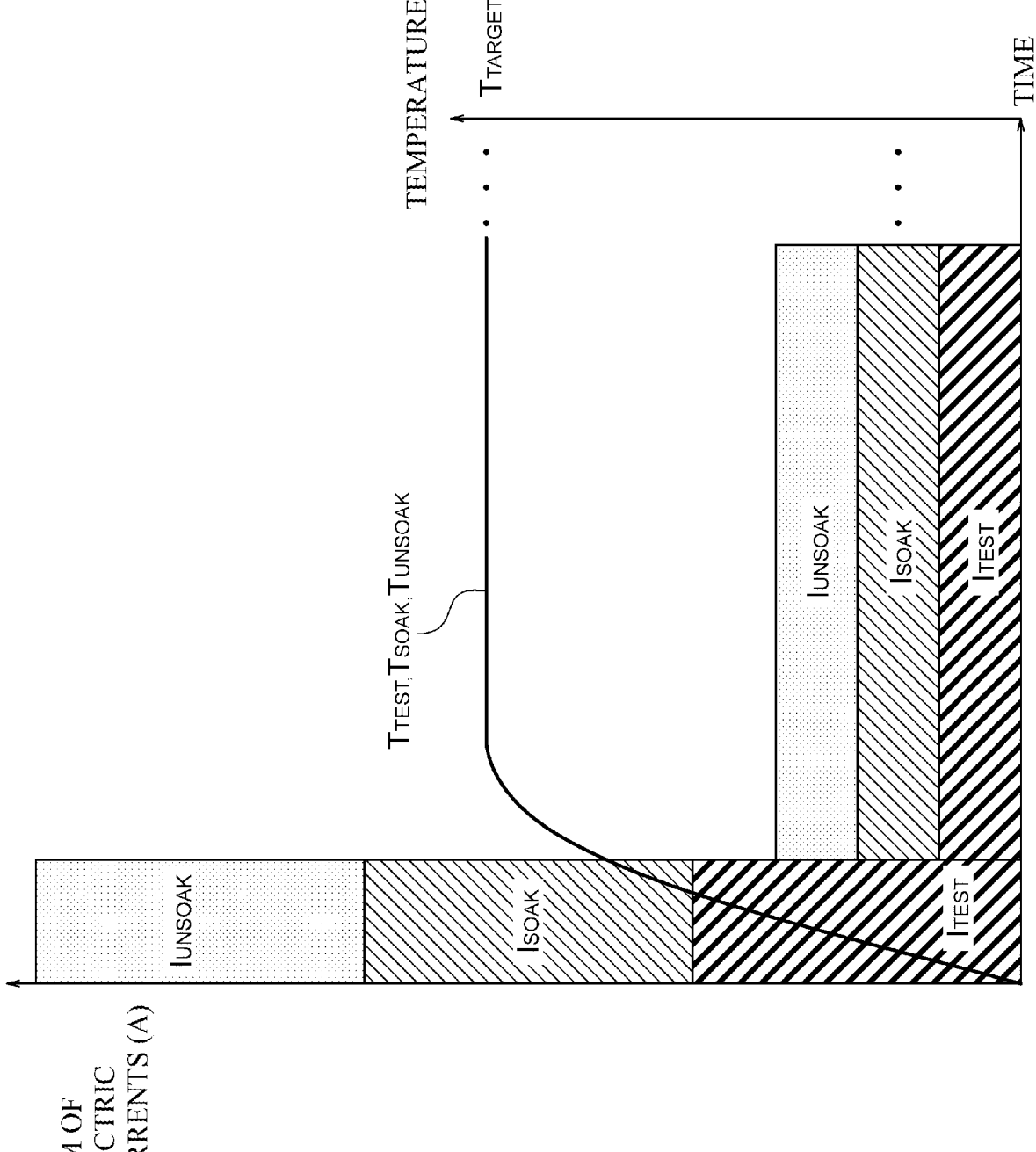
FIG. 8 is a graph illustrating the heater drive control in a comparative example.

FIG. 8 is a graph illustrating the heater drive control in the comparative example. In the conventional heater drive controlling apparatus, as shown in the comparative example illustrated in FIG. 8, since all the heaters in the soak chamber, the test chamber, and the unsoak chamber of the contact unit are turned on simultaneously, the peak current increases at first. Therefore, the power source and the breaker to correspond to the peak current are needed, the power supply system becomes large.

On the other hands, as shown in FIG. 6, according to the heater drive controlling method by the heater drive controlling apparatus in one or more embodiments, it is possible to smooth the amount of the electric currents supplied, and to effectively utilize the power supply system.

In contrast, as shown in FIG. 8, in the comparative example, since the electric currents required after the temperature of each chamber was raised to the target temperature is small, the large power supply system can not be effectively utilized.

The contact unit 20 has operation patterns such as a high-temperature operation, a low-temperature operation, a room-temperature operation, a normal-temperature restoration operation (defrost). Although there are heaters that are not used in accordance with the operation pattern, it is not necessary to change the first priority of one or more embodiments of the heater that is not used.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCES SIGNS LIST

1 . . . Electronic component testing apparatus
5 . . . Test head
10 . . . Handler
20 . . . Contact unit
21 . . . Soak chamber
22*a*-22*f* . . . First heaters
23 . . . Test chamber
24*a*-24*h* . . . Second heaters
25 . . . Unsoak chamber
26*a*-26*d* . . . Third heaters
30 . . . Heater drive controlling apparatus
31 . . . Breaker

31*a* . . . Main breaker (BCU)
31*b* . . . Branch breaker (ACU)
311*a* . . . First wiring group
311*b* . . . Second wiring group
32 . . . Controller
33 . . . PC
33*a* . . . Priority creating unit
33*b* . . . Storage unit
33*c* . . . On/off control unit
34 . . . Communication board
35 . . . Input-output board
36*a*, 36*b* . . . First and second heater driver boards
361*a* . . . Fuses
361*b* . . . Triacs
37 . . . Measurement board
38 . . . Temperature sensor group
40 . . . Power source

What is claimed is:

1. A heater drive controlling apparatus for an electronic component testing apparatus comprising:
  a breaker disposed between a power source and heaters; and
  a controller that controls electric currents supplied from the power source to the heaters in order according to a first priority set for the heaters such that a sum of the supplied electric currents is within a rated current of the breaker, wherein
  the electronic component testing apparatus includes a test chamber, a thermal-stress applying chamber, and a thermal-stress removing chamber each of which includes the heaters, and
  the controller:
    controls the heaters in a cycle,
    compares the rated current with a sum of line currents calculated from a power of the heaters to be turned on in the cycle, and
    controls the supplied electric currents in response to determining that the sum of the line currents is greater than the rated current.

2. The heater drive controlling apparatus according to claim 1, wherein
  the power source is a three-phase AC power source,
  the line currents include three-phase line currents, and
  the controller controls the supplied electric currents such that the three-phase line currents are balanced.

3. The heater drive controlling apparatus according to claim 1, wherein
  the electronic component testing apparatus further includes contact units with the test chamber, the thermal-stress applying chamber, and the thermal-stress removing chamber, and
  the controller changes the first priority based on a third priority set for each of the contact units.

4. The heater drive controlling apparatus according to claim 1, wherein the controller:
  calculates temperature differences between a target temperature and temperatures in the test chamber, the thermal-stress applying chamber, and the thermal-stress removing chamber, wherein the temperatures are detected by temperature sensors disposed in the test chamber, the thermal-stress applying chamber, and the thermal-stress removing chamber, and
  changes the first priority according to the temperature differences.

5. An electronic component handling apparatus comprising the heater drive controlling apparatus according to claim 1.

6. An electronic component testing apparatus comprising the heater drive controlling apparatus according to claim 1.

7. A heater drive controlling apparatus for an electronic component testing apparatus comprising:

a breaker disposed between a power source and heaters; and a controller that controls electric currents supplied from the power source to the heaters in order according to a first priority set for the heaters such that a sum of the supplied electric currents is within a rated current of the breaker, wherein the electronic component testing apparatus includes a test chamber, a thermal-stress applying chamber, and a thermal-stress removing chamber each of which includes the heaters, and the first priority is set based on a second priority set for each of the test chamber, the thermal-stress applying chamber, and the thermal-stress removing chamber.

8. A heater drive controlling apparatus for an electronic component testing apparatus comprising:

a breaker disposed between a power source and heaters; and a controller that controls electric currents supplied from the power source to the heaters in order according to a first priority set for the heaters such that a sum of the supplied electric currents is within a rated current of the breaker, wherein the electronic component testing apparatus includes a test chamber, a thermal-stress applying chamber, and a thermal-stress removing chamber each of which includes the heaters, the heaters comprise:

a first heater; and a second heater having the first priority set lower than the first priority of the first heater, and the controller supplies a first electric current of the electric currents to the first heater, then reduces the first electric current supplied to the first heater, and then supplies a second electric current of the electric currents to the second heater.

* * * * *